(12) United States Patent
Schofield

(10) Patent No.: US 6,570,521 B1
(45) Date of Patent: May 27, 2003

(54) MULTISTAGE SCRAMBLER FOR A DIGITAL TO ANALOG CONVERTER

(75) Inventor: William G. J. Schofield, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/034,735

(22) Filed: Dec. 27, 2001

(51) Int. Cl.[7] .................................. H03M 1/66
(52) U.S. Cl. ........................... 341/144; 341/143
(58) Field of Search .................. 341/144, 143, 341/118, 120

(56) References Cited

U.S. PATENT DOCUMENTS

| | | | |
|---|---|---|---|
| 4,791,406 A | 12/1988 | Mehrgardt et al. | |
| 5,404,142 A | 4/1995 | Adams et al. | |
| 6,124,813 A | * 9/2000 | Robertson et al. | 341/143 |
| 6,304,608 B1 | * 10/2001 | Chen et al. | 375/252 |

OTHER PUBLICATIONS

Fujitsu, *MB86060 16–Bit Interplating Digital to Analog Converter*, Version 1.0, Jan. 2000.

* cited by examiner

Primary Examiner—Brian Young
Assistant Examiner—Joseph Lauture
(74) Attorney, Agent, or Firm—Iandiorio & Teska

(57) ABSTRACT

A multistage scrambler for a digital to analog converter having a non-ideal transfer function resulting from an error function which causes harmonic distortion includes a first shuffling network having a first input for receiving digital data and a first output, the first shuffling network including a first set of data switches; a first sequence generator for selectively interconnecting the first set of data switches to reorder at the first output the digital data received at the first input to reduce the harmonic distortion to lower magnitude colored noise; a second shuffling network having a second input for receiving the reordered digital data from the first output and a second output, the second shuffling network including a second set of data switches; and a second sequence generator for selectively interconnecting the second set of data switches to reorder at the second output the digital data received at the second input to transform the colored noise toward lower power white noise.

12 Claims, 5 Drawing Sheets

MULTISTAGE SCRAMBLER FOR A DIGITAL TO ANALOG CONVERTER

FIELD OF THE INVENTION

This invention relates to a digital to analog multistage scrambler and more particularly to such a scrambler which transforms harmonic distortion to colored noise and then toward lower power white noise.

BACKGROUND OF THE INVENTION

Digital to analog converters (DAC's) employ a number of unary elements to convert digital inputs to analog signals. For example, in a current output DAC, ideally each unary element outputs the same current in response to a bit and the accumulation of those currents constructs the precise current required to convert the digital input to the corresponding analog output. Actually the unary elements do not all produce the same current in response to a bit: some produce slightly higher currents, some lower. These errors accumulate in multibit digital codes resulting in non-ideal transfer functions; different types of non-ideal transfer functions such as bow type and "s" type can lead to different types of harmonic distortions. To combat this a number of different scramblers are used that vary the unary elements called to respond to incoming bits. In data directed scramblers directional switches or swappers are enabled as a function of present and previous data processed. These systems are mainly used in over sampled systems and they reposition the harmonic energy as out of band noise rather than reduce it toward white noise over the whole nyquist bandwidth. U.S. Pat. Nos. 5,404,142; 6,124,813. A constant element activity scrambler operates to assure that each element will be used the same amount over time as all other elements using a look-up table/counter to keep a tally of how many times each unary element has been used. This approach is hardware intensive as a history must be kept of the use of each element. Barrel shifter or constant element rotation scramblers use successive sets of elements in a rotating pattern to reduce harmonic energy by shifting or modulating the harmonics by the frequency of rotation. See U.S. Pat. No. 4,791,406. One problem with this approach is that the error tones or harmonics are moved but not necessarily reduced. Segment swapping scramblers, such as disclosed in Fujitsu Data Sheet MB86060, only partially reduce the noise and only partially reposition it toward low frequency.

BRIEF SUMMARY OF THE INVENTION

It is therefore an object of this invention to provide an improved scrambler for a digital to analog converter.

It is a further object of this invention to provide such an improved scrambler for a digital to analog converter which does not reposition but transforms the energy of harmonic distortion to colored noise and then toward lower power white noise.

It is a further object of this invention to provide such an improved scrambler for a digital to analog converter which is hardware efficient.

It is a further object of this invention to provide such an improved scrambler for a digital to analog converter which addresses all types of error functions.

The invention results from the realization that an improved scrambler for a digital to analog converter having a non-ideal transfer function resulting from an error function that causes harmonic distortion, which addresses all types of error functions with greater hardware efficiency, can be effected by employing a plurality of stages including one shuffling network to reduce the harmonic distortion to lower magnitude colored noise and at least a second shuffling network to transform the colored noise toward lower power white noise.

This invention features a multistage scrambler for a digital to analog converter having a non-ideal transfer function resulting from an error function which causes harmonic distortion. The scrambler includes a first shuffling network having a first input for receiving digital data and a first output. The first shuffling network includes a first set of data switches. There is a first sequence generator for selectively interconnecting the first set of data switches to reorder at the first output the digital data received at the first input to reduce the harmonic distortion to lower magnitude colored noise. A second shuffling network has a second input for receiving the reordered digital data from the first output and a second output. The second shuffling network includes a second set of data switches. A second sequence generator selectively interconnects the second set of data switches to reorder at the second output the digital data received at the second input to transform the colored noise toward lower power white noise.

In a preferred embodiment the first sequence generator may include a pseudo random number generator. The pseudo random number generator may be a maximal length pseudo random generator. The number of taps on the maximal length pseudo random number generator may be a prime number. The second sequence generator may include a pseudo random number generator. That pseudo random number generator may be a maximal length pseudo random number generator. And the number of taps on that maximal length pseudo random number generator may be a prime number. The sequence generators may have an equal number of taps or one of them may have more taps than the other. The first and second sequence generators may produce a maximal length cross correlation sequence. Each of the first and second sequence generators may include a linear feedback shift register, the linear feedback shift registers may produce a maximal length sequence.

BRIEF DESCRIPTION OF THE DRAWINGS

Other objects, features and advantages will occur to those skilled in the art from the following description of a preferred embodiment and the accompanying drawings, in which.

PREFERRED EMBODIMENT

Figure 1:
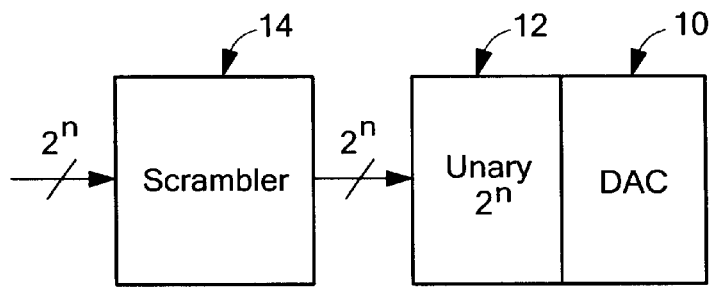
FIG. 1 is a block diagram of a digital to analog converter with a scrambler circuit.

There is shown in FIG. 1 a digital to analog converter (DAC) 10 including a plurality of unary elements 12. Ideally each of the unary elements in a current output DAC would provide exactly the same amount of current in response to a bit at its input. This would produce an ideal linear transfer function for the DAC. However, practically speaking, this does not occur. Some of the unary elements put out more than the desired current, and some less. And the cumulative errors result in non-ideal transfer functions. To combat this problem a scrambler circuit 14 is used to scramble or interchange the $2^n$ inputs at the scrambler so that the different ones of the $2^n$ outputs of the scrambler are applied to different ones of the unary elements 12 thereby averaging the error over time and making the transfer function closer to the linear ideal.

Figure 2:
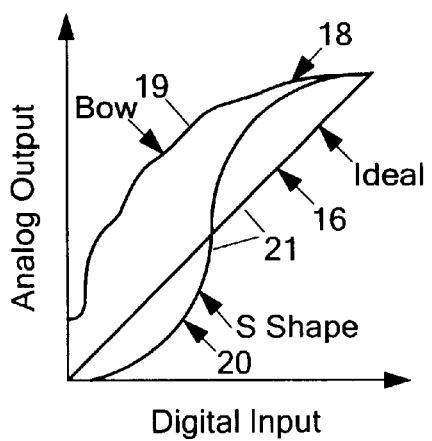
FIG. 2 illustrates an ideal transfer function for a digital to analog converter along with two non-ideal bow and s-shaped transfer functions.
Figure 3:
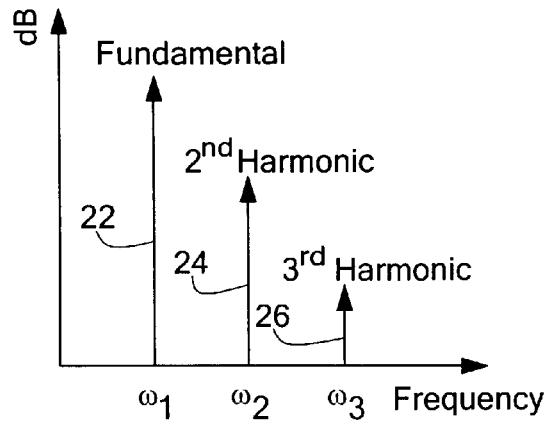
FIG. 3 illustrates the energy distribution of the fundamental and the second and third harmonics as a result of the non-ideal transfer functions of FIG. 2.

The ideal transfer function 16, FIG. 2 is linear. However, due to the variation in the response of each of the individual unary cells 12, FIG. 1, to the digital inputs, non-linear transfer functions result: for example a bow-shaped non-linear transfer function 18 or an s-shaped non-linear transfer function 20, or some combination of both. In the case of the bow shaped non-ideal transfer function the error function is represented by the area 19 between the bow transfer function 18 and the ideal transfer function 16. In the case of the s-shaped non-ideal transfer function the error function is represented by the area 21 between the s-shaped, non-ideal transfer function 20 and the ideal transfer function 16. The bow-shaped non-ideal transfer function 18 produces a fundamental 22, FIG. 3 and significant energy at the second harmonic 24. S-shaped non-ideal transfer function 20 produces fundamental 22 and significant energy at the third harmonic 26.

In prior art approaches, as explained in the Background, the noise resulting from these non-ideal transfer functions was either shifted out of band or was reduced in some fashion and sometimes both was done to some limited extent. However, in the attempt to reduce the noise or shift it, the scrambler employed substantial hardware especially when dealing with higher order numbers of input bits.

Figure 4:
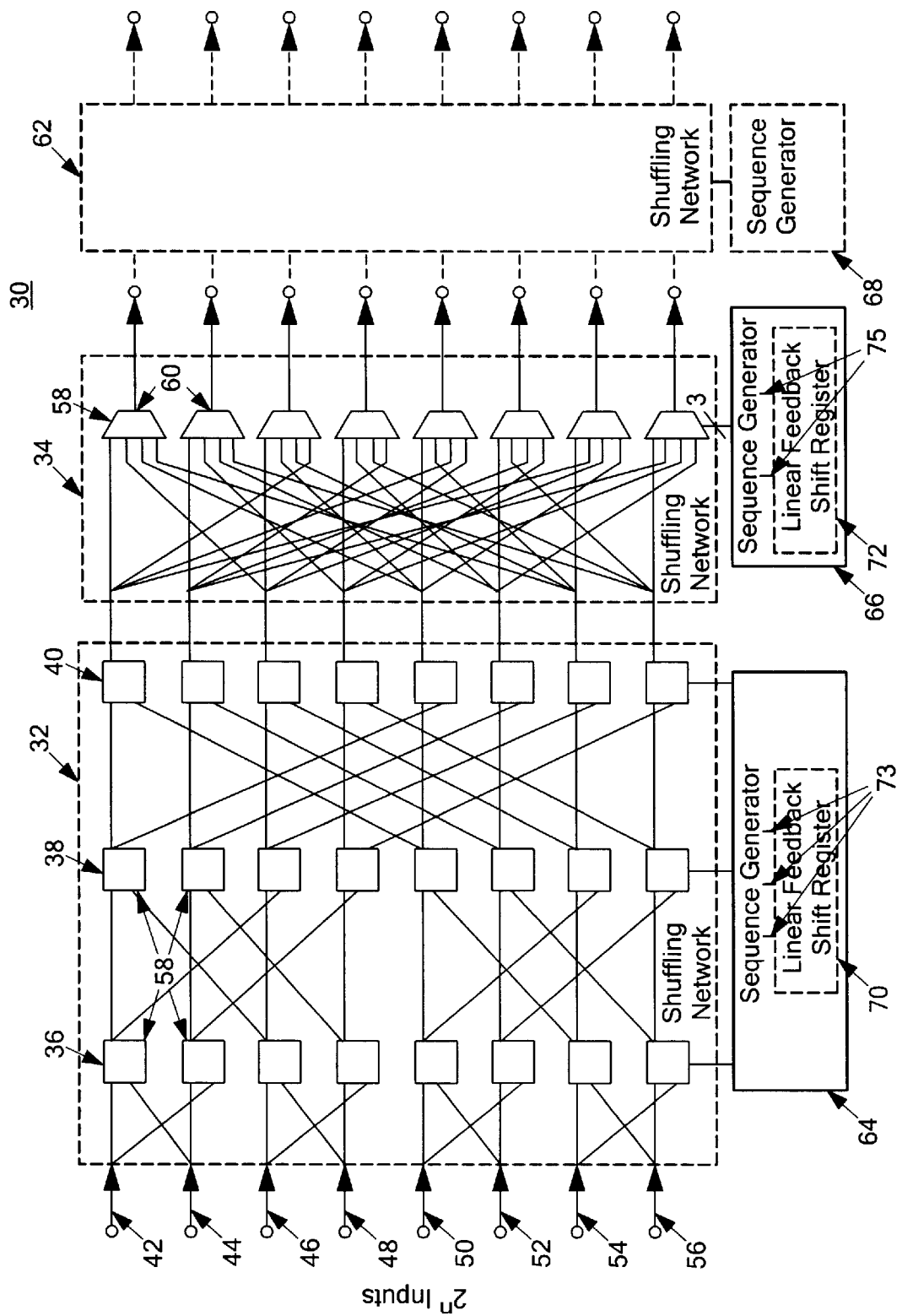
FIG. 4 is a schematic block diagram of a multistage scrambler for a digital to analog converter according to this invention.

In accordance with this invention, a scrambler 30, FIG. 4 is constructed using two or more shuffling networks 32 and 34, the first of which receives input bits and reduces the harmonic distortion or energy to colored noise. There is at least one second shuffling network 34 and the additional one or more shuffling networks convert the colored noise toward white noise at lower power. By using two or more smaller shuffling networks the amount of hardware is substantially reduced as compared to prior art approaches while the noise reduction is comparable. Shuffling network 32 is shown as having $2^n$ bit input where n is 3, for example. Shuffling network 32 is then shown including n columns 36, 38, and 40 and $2^n$ rows 42, 44, 46, 48, 50, 52, 54, and 56 of data switches 58. But this is not necessary. The rows and columns do not have to correspond to $2^n$ and n: the invention works using only one column, for example. The second shuffling network 34 employs only a single column 58 of data switches 60. The second shuffling network 34 receives the digital input from the first shuffling network 32 and converts it from colored noise more toward white noise with lower power. Subsequent shuffling networks, e.g., 62 may be added to reduce the power and more closely approximate white noise. Each of the shuffling networks 32, 34 and 62 has associated with it a sequence generator 64, 66, and 68 which is preferably a maximal length pseudo random number generator which may be implemented with a linear feed back shift register 70 and 72 as shown with respect to sequence generators 64 and 66, respectively. Registers 70 and 72 produce $2^n$ and $2^m$ length sequences where n and m are the number of taps 73, 75, on the registers. One register may have more taps than the other or the number of taps may be equal e.g., n=m and preferably the number of taps is a prime number. In order to produce best performance in accordance with this invention, each of the sequence generators should have low auto correlation and in addition the cross correlation between the sequence generators should be low.

Figure 5:
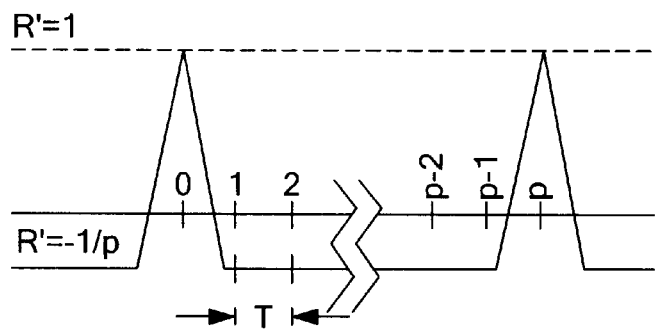
FIG. 5 illustrates the normalized auto correlation function of a pseudo random sequence of length p.
Figure 6:
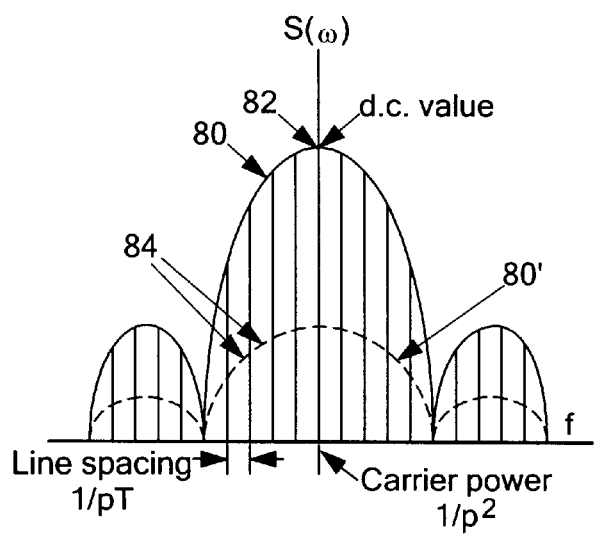
FIG. 6 illustrates a power spectrum of the auto correlation function of FIG. 5 in accordance with equation (1)

Each sequence generator preferably has a normalized auto correlation function of a pseudo random number sequence of length p as shown in FIG. 5 where the auto correlation is a maximum at zero and multiples of the sequence length p and at all other points is equal to $-1/p$: each sequence generator is a maximal length pseudo random number generator. The power spectrum of this auto correlation function can be expressed as:

$$S(\omega) = \overbrace{\frac{p+1}{p^2} \left[ \frac{\text{Sin}(\omega T/2)}{(\omega T/2)} \right]^2 \sum_{\substack{n=-\infty \\ n \neq 0}}^{\infty} \left[ \delta\left(\omega - \frac{2\pi n}{pT}\right) \right]}^{Shape} + \overbrace{\frac{1}{p^2} \delta(\omega)}^{d.c.} \quad (1)$$

where p is the sequence length, δ is the dirac function and T is the pulse spacing. The first two terms in equation (1) as indicated represent the shape of the power spectrum, while the last term represents the d.c. value. The power spectrum is illustrated in FIG. 6 where the shape of the envelope 80 corresponds to the first two terms representing the shape in equation (1) and the d.c. value is indicated at 82. By increasing the sequence length p the line spacing 1/pT decreases and the power decreases as indicated at 84 by the increased number of lines shown in phantom and the noise energy across the spectrum is reduced as indicated by the decreased envelope 80'. While the length of the pseudo random sequence p is important in the noise reduction capability, the cross correlation between the sequence generators is also important according to this invention. Consider the following example for two simple sequences generated from a two stage and a three stage linear feedback shift register:

First sequence 1110100

$(n = 3, 2^n - 1 = 7)$

Second sequence 110

$(m = 2, 2^n - 1 = 3)$ where n and m are the number of taps on the respective registers and preferably are prime numbers.

The two sequences are now compared bit by bit until both sequences have repeated an exact number of times.

First sequence   111010011101001110100
Second sequence  110110110110110110110
Modulo-2 sum     001100101011111000010

Number of zeros in modulo-2 sum = 11

Number of ones in modulo-2 sum = 10

Normalized cross correlation function$(R') = \frac{11-10}{11+10} = \frac{1}{21}$ Generally speaking for the best noise reduction in accordance with this invention, the normalized cross correlation function should be $$\frac{1}{(2^n - 1)*(2^m - 1)}.$$

That is considered a maximal length cross correlation sequence having a minimum cross correlation function. The poorer noise reduction performance obtained even with very long sequences when the cross correlation is poor can be seen from the following example where two sequences of degree 14 giving sequence lengths of $2^{14}-1=16383$ have been used.

| | |
|---|---|
| First sequence | ...1 1 0 0 1 1 1 1 1 0 0 1 1 1 0 1 1 0 0 1 0... |
| Second sequence | ...1 1 0 1 0 1 0 1 1 1 0 1 0 0 0 0 1 0 0 1 0... |
| Modulo-2 sum | ...0 0 0 1 1 0 1 0 0 1 0 0 1 1 0 1 0 0 0 0 0... |
| | X X X X X X X |

The modulo-2 sum has a predominance of zeros, which in itself is sufficient to cause high value of cross correlation. On closer inspection it can be seen that for the section of the sequences shown every third bit of the modulo-2 sum is zero. This is repeated throughout the sequence. Examination of the remaining bits show an exact balance of ones and zeros. The result is a predominance of zeros overall making for poor cross correlation.

Figure 7:
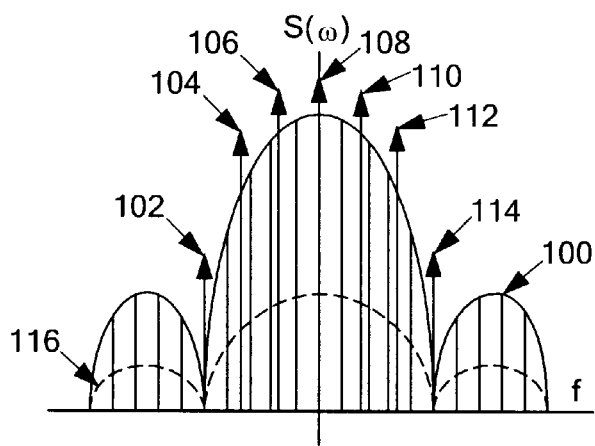
FIG. 7 illustrates a power spectrum similar to that shown in FIG. 6 showing the poor performance obtained when there is high cross correlation between the sequence generators of FIG. 4 and when there is low cross correlation between the sequence generators of FIG. 4 in accordance with this invention.

The result of the poor cross correlation obtained in this instance is shown in the power spectrum of FIG. 7 where in addition to the normal envelope 100 there are a number of error tones 102, 104, 106, 108, 110, 112 and 114 which localize the energy at certain harmonics and degrade the spurious free dynamic range (SFDR). This is in sharp contrast to the teachings of this invention where the use of sequences with low auto correlation and low cross correlation as well, result in a much reduced noise level 116 without localized harmonic energy at lower energy levels more nearly white noise in nature.

Figure 8:
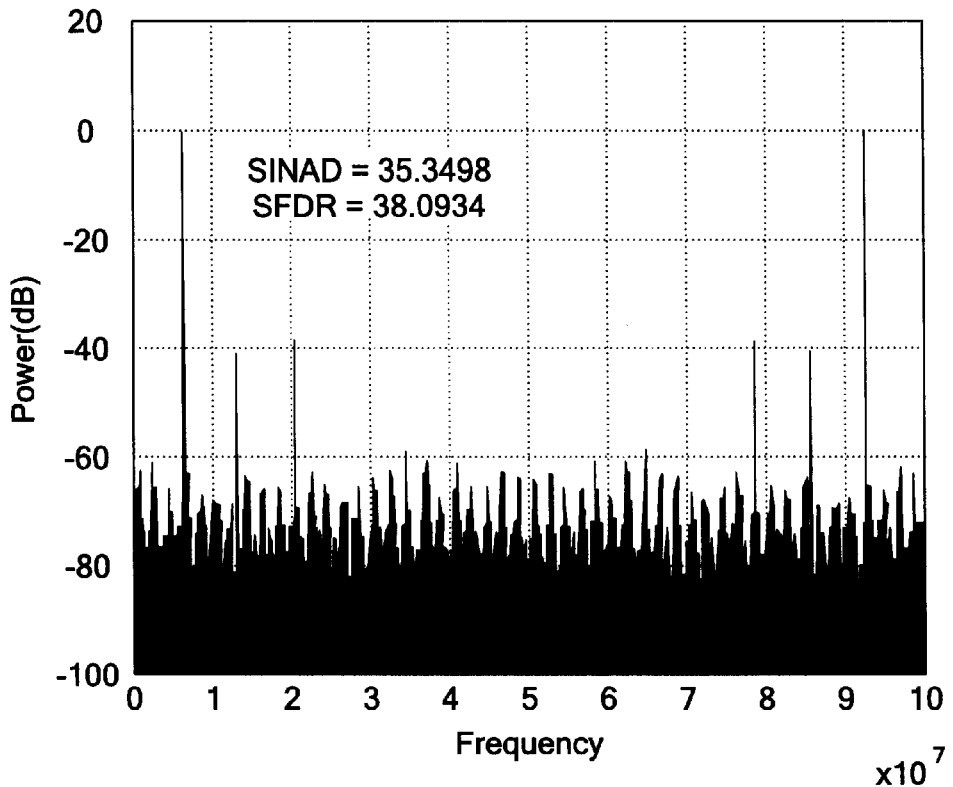
FIG. 8 illustrates the power spectrum at the output of the DAC without a scrambler input.
Figure 9:
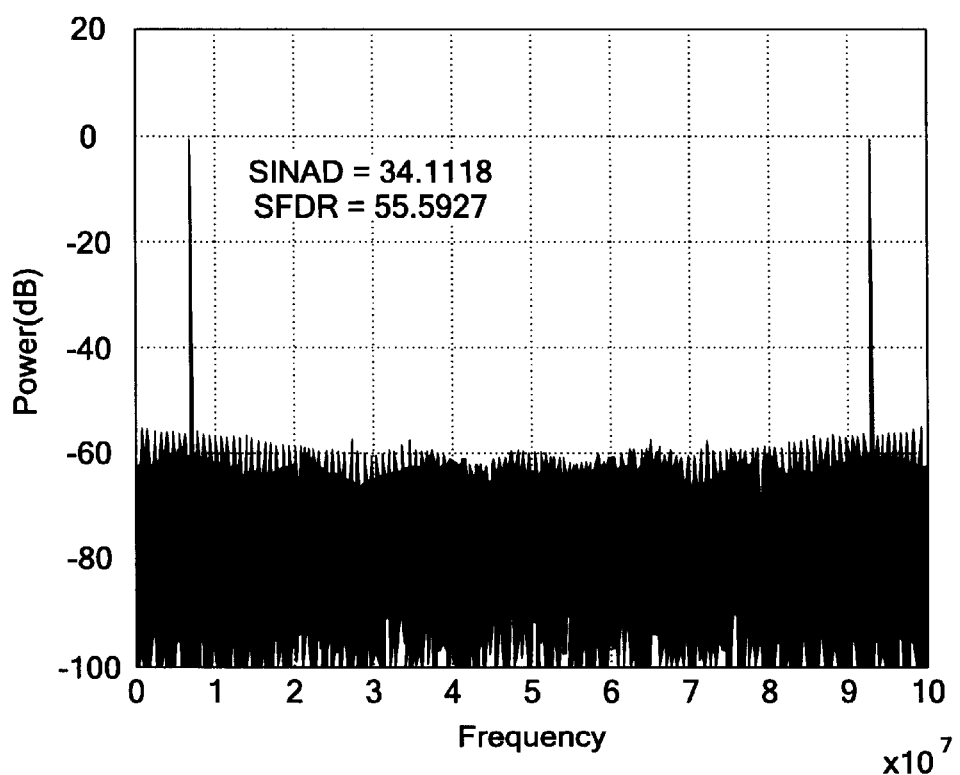
FIG. 9 illustrates the power spectrum at the output of the DAC with only the first shuffling network engaged in FIG. 4 according to this invention showing the reduction of the harmonic energy to colored noise.
Figure 10:
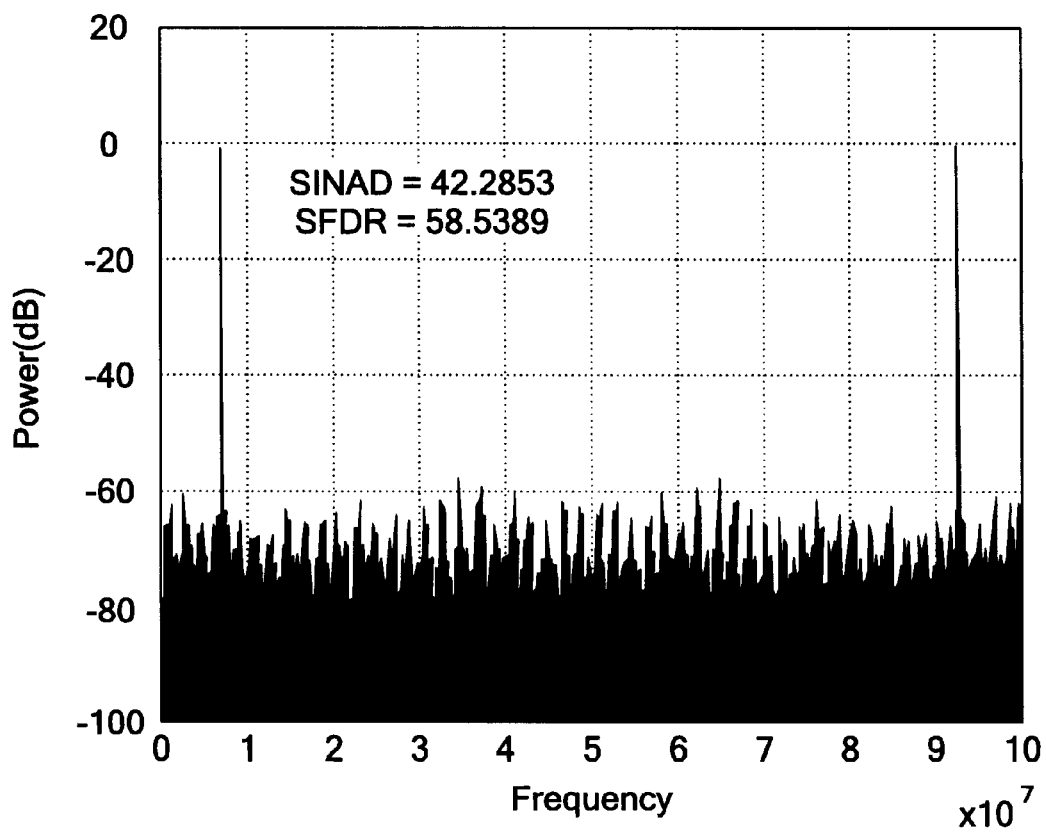
FIG. 10 illustrates the power spectrum at the output of the DAC with the first and second shuffling network engaged in FIG. 4 according to this invention with lower power and more nearly approaching white noise.

The improved performance according to this invention is demonstrated with respect to the power spectrums in FIGS. 8, 9, and 10 where FIG. 8 represents the power spectrum at the output of the DAC without the use of the scrambler circuit 30, FIG. 4 according to this invention. FIG. 9 shows the power spectrum of the output of the DAC when only the first shuffling network 32 of scrambler 30 has been used so that the noise has been reduced to a colored noise. And FIG. 10 demonstrates the output of the DAC when the second and or subsequent shuffling networks 34 are used to transform the colored noise to more nearly white noise and reduce it to lower power.

The savings in hardware alone can be seen from a comparison of the typical implementation of: a) the scrambler of U.S. Pat. No. 5,404,142; b) the scrambler made from a pseudo random number generator employing but one shuffling network; and c) a device made according to this invention using two or more shuffling networks employing 127 bit architecture. Implementation a) would require 448 swapper cells comprising 448 flip flops, 896 X-or gates, and 896 2:1 multiplexors. A single shuffling network implementation of the pseudo random number array b) would use 448 swapper cells comprising 896 2:1 multiplexors, 448 flip flops, and 100 X-or gates. This invention c) would employ 1397 2:1 multiplexors, 13 flip flops, and 4 X-or gates. Assuming a flip flop uses 12 transistors, an exclusive or gate uses 8 and a 2:1 multiplexor uses 4, a) U.S. Pat. No. 5,404,142 would require 16,128 transistors, a single shuffling network implementation of a pseudo random number generator b) would require 9,760 transistors but the implementation of this invention c) would require only 5,760 transistors. Thus, this invention provides a three-fold reduction in hardware with respect to U.S. Pat. No. 5,404,142 and two fold with respect to a single pseudo random number generator shuffling network.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A multistage scrambler for a digital to analog converter having a non-ideal transfer function resulting from an error function which causes harmonic distortion, said scrambler comprising:

a first shuffling network having a first input for receiving digital data and a first output, said first shuffling network including a first set of data switches;

a first sequence generator for selectively interconnecting said first set of data switches to reorder at said first output the digital data received at said first input to reduce the harmonic distortion to lower magnitude colored noise;

a second shuffling network having a second input for receiving the reordered digital data from said first output and a second output, said second shuffling network including a second set of data switches; and a second sequence generator for selectively interconnecting said second set of data switches to reorder at said second output the digital data received at said second input to transform the colored noise toward lower power white noise.

2. The multistage scrambler of claim 1 in which said first sequence generator includes a pseudo random number generator.

3. The multistage scrambler of claim 2 in which said pseudo random number generator is a maximal length pseudo random number generator.

4. The multistage scrambler of claim 3 in which the number of taps on said maximal length pseudo random number generator is a prime number.

5. The multistage scrambler of claim 1 in which said second sequence generator includes a pseudo random number generator.

6. The multistage scrambler of claim 5 in which said pseudo random number generator is a maximal length pseudo random number generator.

7. The multistage scrambler of claim 6 in which the number of taps on said maximal length pseudo random number generator is a prime number.

8. The multistage scrambler of claim 1 in which said sequence generators have an equal number of taps.

9. The multistage scrambler of claim 1 in which one of said sequence generators has a greater number of taps than the other.

10. The multistage scrambler of claim 1 in which said first and second sequence generators produce a maximal length cross correlation sequence.

11. The multistage scrambler of claim 10 in which each said first and second sequence generators includes a linear feedback shift register.

12. The multistage scrambler of claim 11 in which each of said linear feedback shift registers produces a maximal length sequence.

* * * * *